United States Patent [19]

Mitake

[11] Patent Number: 4,678,950
[45] Date of Patent: Jul. 7, 1987

[54] OUTPUT CIRCUIT HAVING AN IMPROVED PROTECTING CIRCUIT

[75] Inventor: Kenjiro Mitake, Tokyo, Japan
[73] Assignee: NEC Corporation, Tokyo, Japan
[21] Appl. No.: 609,177
[22] Filed: May 11, 1984
[30] Foreign Application Priority Data
   May 13, 1983 [JP] Japan .................................. 58-83533
[51] Int. Cl.[4] ...................... H03B 1/04; H03F 21/00;
                                          H01L 29/78; H02H 3/20
[52] U.S. Cl. .............................. 307/550; 307/200 B;
      307/475; 307/473; 307/270; 330/207 P;
      330/298; 361/91; 357/23.13
[58] Field of Search ............. 361/91; 330/207 P, 298;
      307/270, 200 B, 473, 475, 549, 550, 584;
      357/23.13

[56] References Cited
U.S. PATENT DOCUMENTS
3,792,292  10/1985  Priel ................................... 307/473
4,587,446  5/1986  Okumura .......................... 307/473

OTHER PUBLICATIONS
Tristate Driver Protection by H. L. Kalter IBM Technical Disclosure Bulletin, vol. 22, No. 3, Aug. 1979.

Primary Examiner—Stanley D. Miller
Assistant Examiner—M. R. Wambach
Attorney, Agent, or Firm—Sughrue, Mion, Zinn, Macpeak, and Seas

[57] ABSTRACT

An output circuit which has an improved protection circuit against an abnormal voltage applied to an output terminal. The output circuit is of the type having first and second switching transistors operating in a push-pull manner, the output being derived from the intermediate connection of the first and second switching transistor. A protection circuit is coupled between a gate of the first switching transistor and the output terminal. The protection circuit provides a current path between the gate of the first switching transistor and the output terminal when an abnormal voltage is applied to the output terminal.

11 Claims, 9 Drawing Figures

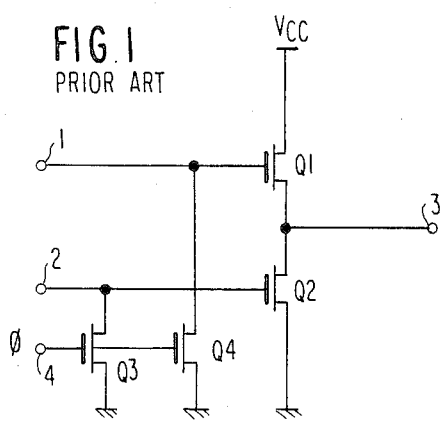
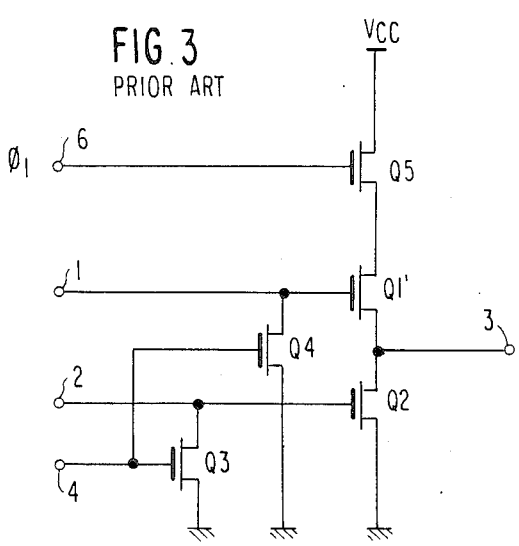
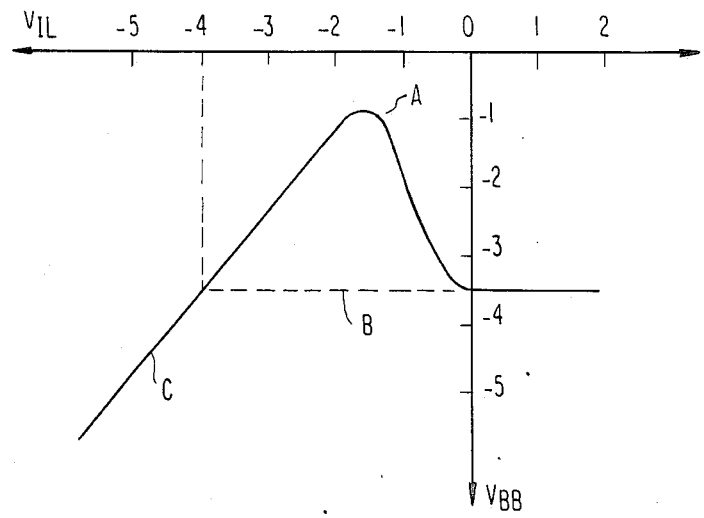
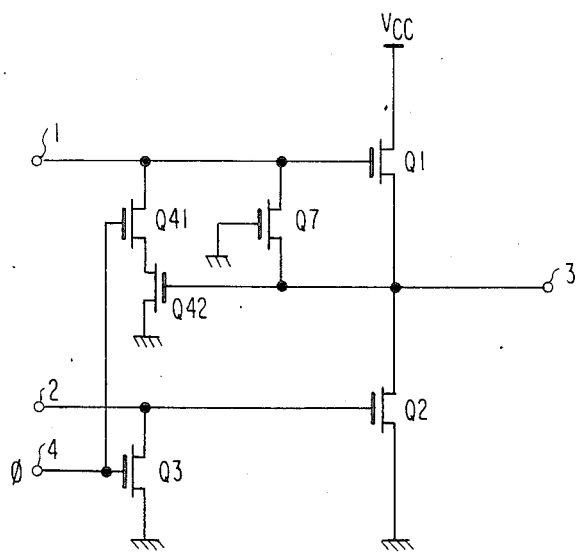

OUTPUT CIRCUIT HAVING AN IMPROVED PROTECTING CIRCUIT

FIELD OF THE INVENTION

The present invention relates to an output circuit composed of insulated gate field effect transistors (hereinafter abbreviated as IFGET's), and more particularly to a tri-state type output circuit which can operatively maintain its output terminal at a high impedance state.

BACKGROUND OF THE INVENTION

Tri-state circuits are widely used as output circuits having large driveability and operable with small power consumption. The tri-state circuit is basically composed of two switching IGFET's connected in series so as to form a push-pull circuit and a control circuit for simultaneously rendering the two IGFET's non-conducting. In the latter state the output terminal is floating and presents a very high impedance looking back into the circuit.

The output terminal of the tri-state circuit is typically connected to an I/O bus line to which other output circuits or input circuits are connected. If an abnormal voltage, (e.g., a negative voltage in the case where N-channel type IGFET's are used) is applied to the bus line when the two switching IGFET's are non-conducting, the effective source-gate voltages of both IGFET's will become forward-biased. Consequently, the two IGFET's will become conducting and will pass an abnormal current therethrough. Furthermore, impact ionization will occur in one of the switching transistors, resulting in an abnormal substrate current. This is a malfunction of the circuit and can cause a breakdown of the transistor.

One solution to the above problem is proposed in U.S. patent application Ser. No. 366,778, assigned to the assignee herein. A protecting IGFET is inserted between a power voltage terminal and one end of the serially connected switching IGFET's. The protecting IFGET is controlled to have a high impedance when both switching transistors are in the non-conducting state. Accordingly, even if an abnormal voltage is applied to the output terminal, no current or only a small current will be produced between the output terminal and the power voltage terminal. Therefore, abnormal operation can be suppressed. In this connection, it is favorable that the above-described protecting IGFET should transmit the potential at the power voltage terminal to the series circuit of transistors without substantially lowering the potential level when it is conducting, and in view of this requirement it is practical to use a depletion type IGFET as the protecting IGFET.

However, the above mentioned technique requires an additional control signal to control the protecting IGFET. This increases the complexity of the control circuitry. Furthermore, since the protecting IGFET and one of the switching IGFET's are connected in series between the output terminal and the power voltage terminal, they should be formed to have large conductances in order to establish a sufficient conducting path between the output terminal and the power voltage terminal. Thus, the protecting IGFET and the mentioned one switching IGFET must have twice the conductance of that required for the switching IGFET's in a conventional tri-state circuit. Therefore, a large chip area is necessary to form the tri-state circuit proposed by the abovementioned patent application.

SUMMARY OF THE INVENTION

It is one object of the present invention to provide a tri-state type output circuit having an improved protecting circuit.

It is another object of the present invention to provide a tri-state type output circuit which is suitable for a highly integrated structure.

An output circuit according to the present invention is of the type having a first IGFET coupled between a first voltage terminal and an output terminal, a second IGFET coupled between the output terminal and a second voltage terminal, input means for controlling the first and second IGFET's in complementary manner to generate a data output at the output terminal, and a control means for operatively making both of the first and second IGFET's non-conducting thereby to set the output terminal at a high impedance state. The output circuit comprises protection means coupled between the output terminal and the gate of the first IGFET, the protection means providing an electrical path between the output terminal and the gate of the first IGFET only when an abnormal voltage is applied to the output terminal.

According to the present invention, even when an abnormal voltage is applied to the output terminal from the outside, the gate of the first IGFET is electrically connected to the output terminal, that is the source of the first IGFET, by the electrical path provided by the protection means. Therefore, the first IGFET will never be set in a forward biased state and it will remain non-conducting. Accordingly, an abnormal voltage will not cause malfunction of the output circuit.

In addition, according to the present invention, no modification is made to source-drain paths of the first and second IGFET's as compared to the prior art tri-state output circuit and no special control signal is necessary to control the protection means. Hence, there is provided a tri-state circuit which can be highly integrated on a semiconductor substrate.

In one aspect of the present invention, the protection means includes a third IGFET whose source-drain path is connected between the gate of the first IGFET and the output terminal. The gate of the third transistor is biased at a reference potential.

Also, in the present invention, the control means may be composed of a series circuit of fourth and fifth IGFET's coupled between the gate of the first IGFET and the reference potential, a gate of the fourth IGFET receiving a control signal, a gate of the fifth IGFET being coupled to the output terminal, and a sixth IGFET coupled between the gate of the second IGFET and the reference potential and having a gate receiving the control signal.

BRIEF DESCRIPTION OF THE DRAWINGS

FIG. 1 is a schematic diagram showing a conventional tri-state output circuit;

FIG. 2 is a diagram showing the relation between a low level voltage, VIL, applied to an output terminal and a substrate bias voltage $V_{BB}$;

FIG. 3 is a schematic diagram showing an improved tristate output circuit according to a copending patent application;

FIG. 4 is a schematic diagram showing a tri-state output circuit according to a preferred embodiment of the present invention;

DETAILED DESCRIPTION OF THE INVENTION

Figure 5A:
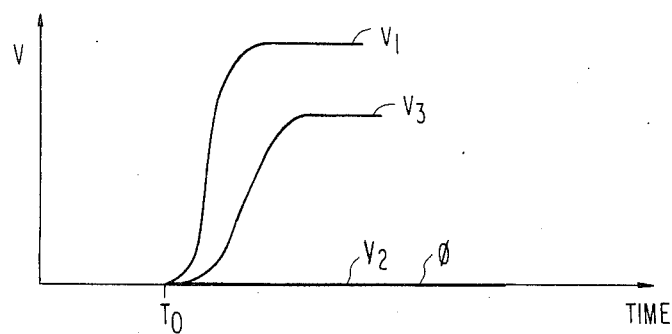
FIGS. 5A and 5B are waveform diagrams explaining operations of the circuit of FIG. 4.

FIG. 1 illustrates a conventional push-pull output circuit employing IGFET's. The circuit will be described, assuming for the sake of simplicity, that N-channel type MISFET's are employed.

The conventional push-pull output circuit comprises a first input terminal 1, a second input terminal 2 to which is applied a signal that is complementary to the signal applied to the first input terminal 1, a control terminal 4 to which is applied a control signal $\phi$ for maintaining an output terminal 3 at a high impedance state, switching IGFET's $Q_1$ and $Q_2$, and control IGFET's $Q_3$ and $Q_4$ for maintaining the output terminal 3 at a high impedance state.

When the control signal $\phi$ is at a low level, the IGFET's $Q_3$ and $Q_4$ are held non-conductive. This allows the output circuit to function as a push-pull circuit. The first and second input terminals 1 and 2 are supplied with signals which are complementary to each other. If the first terminal 1 is at a high level while the second input terminal 2 is at a low level, the IGFET $Q_1$ is held conducting (ON) while the IGFET $Q_2$ is held non-conducting (OFF), and thus a high level voltage is applied at the output terminal 3. On the contrary, if the first input terminal 1 is held at a low level while the second input terminal 2 is held at a high level, a low level voltage is applied to the output terminal 3 through the IGFET $Q_2$. When the control signal $\phi$ is at a high level, the IGFET's $Q_3$ and $Q_4$ are held ON, grounding the gates of the IGFET's $Q_1$ and $Q_2$ and turning OFF those IGFET's, resulting in a high impedance state of the output terminal 3. A problem occurs if, during the high impedance output state, an abnormal voltage, i.e. a negative voltage, is applied to the output terminal. If the applied negative voltage becomes so low that the potential difference relative to the ground level exceeds the threshold voltages of the IGFET's $Q_1$ and $Q_2$, these IGFET's will turn ON and conduct current. Accordingly, a current is caused to flow through the output terminal 3. Under the abovementioned condition, a potential difference larger than the voltage source level is present between the drain and source of the IGFET $Q_1$ and hence the potential difference between the gate and source is smaller than that between the drain and source, resulting in IGFET $Q_1$ being saturated. It is known that generally in an IGFET operating in the saturated region, if the potential difference between the drain and source is large, impact ionization will occur by a channel current in a pinch-off region in the channel, and, hence, a substrate current will be greatly increased. Therefore, under the condition that the IGFET's $Q_1$ and $Q_2$ have been turned ON by applying a negative voltage to the output terminal 3 as described above, impact ionization will occur in IGFET $Q_1$, and hence, the substrate current is greatly increased.

FIG. 2 shows the relation between the voltage $V_{IL}$ applied to the output terminal 3 and a substrate bias voltage $V_{BB}$. In this example, the semiconductor substrate on which the output circuit of FIG. 1 is formed is biased at $-3.5$ V by a built-in bias voltage generator formed on the same semiconductor substrate. When the voltage $V_{IL}$ applied to the output terminal 3 is in a normal voltage range, i.e., 0V or more, no change occurs in the substrate bias voltage $V_{BB}$. When the voltage $V_{IL}$ is in the range of 0 to $-4$ V, that is when the voltage $V_{IL}$ is negative and does not forward bias the PN junction of the substrate and the source of the IGFET $Q_1$, the substrate bias voltage $V_{BB}$ changes as indicated by a curve A due to the impact ionization caused by the IGFET $Q_1$ conducting in the saturated region. If impact ionization does not occur, the substrate voltage $V_{BB}$ would become as indicated by dashed line B.

When the voltage $V_{IL}$ becomes more negative than $-4$ V, the PN junction of the substrate and the source of the IGFET $Q_1$ is forward biased, and hence the substrate bias voltage $V_{BB}$ changes in proportion to the voltage $V_{IL}$, as indicated by a line C.

As described above, a negative voltage applied to output terminal 3 causes a change in the substrate bias voltage, resulting in malfunctions of IGFET's formed on the same semiconductor substrate.

With reference to FIG. 3, a tri-state output circuit proposed by the above mentioned co-pending patent application will be explained.

In FIG. 3, the portions corresponding to those in FIG. 1 are denoted by the same reference numerals.

The circuit construction relating to output switching IGFET's $Q_1'$ and $Q_2$ and impedance control IGFET's $Q_3$ and $Q_4$ is identical to that shown in FIG. 1. Here, an additional IGFET $Q_5$ is connected between a voltage source terminal Vcc and the drain of the switching IGFET $Q_1'$. A signal $\phi_1$ that is complementary to the signal $\phi$ applied to the control terminal 4, is applied via another control terminal 6 to the gate of IGFET $Q_5$. The MISFET $Q_5$ is added for the purpose of suppressing the drain-source voltage of the output switching IGFET $Q_1'$ when the output terminal 3 is maintained at a high impedance state. According to this structure, when a negative voltage is applied to the output terminal 3 under the high impedance state, since the internal resistance of the IGFET $Q_5$ is set at a high value, the drain-source voltage of the IGFET $Q_1'$ is reduced to a low value, and hence impact ionization would be avoided. Accordingly, the substrate potential will not rise, and the operation of the device will not be adversely affected thereby.

However, this circuit has the following disadvantages. Two IGFET's $Q_5$ and $Q_1'$ are connected between the power voltage terminal Vcc and the output terminal 3. Thus, the effective conductance of the series connection of the IGFET's $Q_5$ and $Q_1'$ must be designed to have a value approximately equal to that of the IGFET $Q_1$ in FIG. 1. Therefore, each of IGFET's $Q_1'$ and $Q_5$ must have twice the conductance of the IGFET $Q_1$ in FIG. 1. This means that the sizes of the IGFET's $Q_1'$ and $Q_5$ are twice the size of the IGFET $Q_1$ in FIG. 1. As a consequence, the area required for the IGFET's $Q_1'$ and $Q_5$ is four times the area for the IGFET $Q_1$ in FIG. 1. (In this connection, it will be noted that the IGFET $Q_1$ in FIG. 1 has the largest size among the IGFET's formed on the same semiconductor chip. For example, the IGFET $Q_1$ in FIG. 1 is generally formed with a channel width of 1500 micron or more.) Accordingly, it is obvious that the circuit shown in FIG. 3 is not suitable for fabrication as a high density integrated structure.

Further, the signal $\phi 1$, for controlling the IGFET $Q_5$ is additionally necessary. This causes complexity in the control circuitry. Also, in order to fabricate IFGET $Q_5$, additional manufacturing steps are required.

With reference to FIG. 4, a tri-state output circuit according to a preferred embodiment of the present invention will be explained.

The structure corresponding to the IGFET's $Q_1$, $Q_2$ and $Q_3$ is the same as that corresponding to the similar IGFET's in FIG. 1. A protection means comprising an IGFET $Q_7$ is coupled between the gate of the IGFET $Q_1$ and the output terminal 3. The gate of the IGFET $Q_7$ is grounded. The IGFET $Q_7$ is provided for preventing impact ionization.

A series circuit of IGFET's $Q_{41}$ and $Q_{42}$ is coupled between the gate of IGFET $Q_1$ and ground potential. A gate of IGFET $Q_{41}$ receives the control signal $\phi$, which is also applied to a gate of IGFET $Q_3$. The gate of IGFET $Q_{42}$ is connected to the output terminal 3.

Referring to FIG. 5A, a normal output operation will be explained. In this example, a potential $V_1$ at the input terminal 1 changes from a low level to a high level at a time point $T_o$ while a signal $V_2$ at the input terminal 2 remains at a low level. Throughout this operation control signal $\phi$ remains at a low level so that the IGFET's $Q_3$ and $Q_{41}$ are non-conducting. In response to the high level of the signal $V_1$, IGFET $Q_1$ turns on while IGFET $Q_2$ remains non-conducting. Accordingly, a high level output signal $V_3$ is produced at the output terminal 3. During this operation, the IGFET $Q_7$ is not forward-biased and remains nonconducting. Therefore, IGFET $Q_7$ has no effect on the normal operation.

Also, when $V_3$ becomes high, the IGFET $Q_{42}$ is placed in the conducting state. However, IGFET $Q_{41}$ remains in the non-conducting state so that no current path is established between the input terminal 1 and ground potential.

If the input at terminal 2 is high and the input at terminal 1 is low, $Q_2$ will turn on, $Q_1$ will be off, and terminal 3 will be at a low level. In this case, each of the transistors $Q_3$, $Q_7$ and $Q_{42}$ will remain in the non-conducting state.

The operation of the circuit when $\phi$ is raised to a high level to place the circuit in a high impedance state will now be explained. If $Q_1$ had been conducting and $Q_2$ turned off, the voltage at terminal 3 will be high and $Q_{42}$ will be in the conducting state. When $\phi$ goes high, $Q_3$ turns on, thereby cutting off and holding off $Q_2$. Also $Q_{41}$ is rendered conducting, and along with $Q_{42}$ grounds terminal 1, cutting off $Q_1$. Then the circuit is now in the high impedance state.

If, prior to the application of a high level voltage at $\phi$, $Q_1$ was off and $Q_2$ was conducting, the application of a high level $\phi$ will turn off $Q_2$ resulting in the circuit being in the high impedance state. The feedback circuit from the source of $Q_1$ to its gate, comprising $Q_{41}$ and $Q_{42}$, will maintain $Q_1$ in the non-conducting state even if the voltage at terminal 1 rises.

Figure 5B:
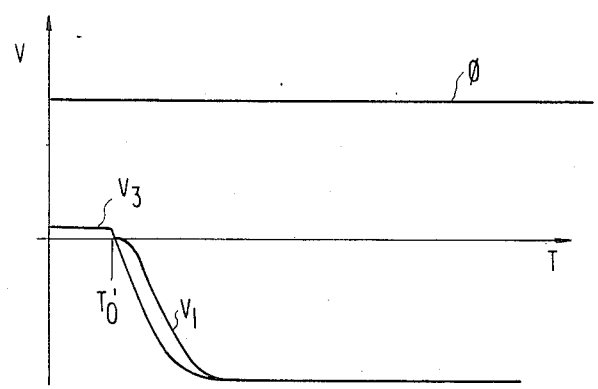

The condition of the circuit when in the high impedance state and a negative voltage is applied to terminal 3 will be explained with reference to FIG. 5B, wherein $V_3$ represents the voltage at the terminal 3, $V_1$ represents the voltage at the gate of $Q_1$ and $\phi$ is the voltage level of control signal $\phi$. It is assumed that $V_3$ goes negative at time $T'_o$. When it becomes sufficiently negative to exceed the threshold of $Q_7$, the latter turns on thereby causing the voltage $V_1$ at the gate of $Q_1$ to follow $V_3$ as shown in the graph. As a result, the threshold of $Q_1$ will not be exceeded and $Q_1$ will remain off.

It will be noted that $Q_{42}$ will be non-conducting and therefore $Q_{41}$ and $Q_{42}$ will not hold the gate of $Q_1$ at ground. Consequently the gate of $Q_1$ can follow the voltage $V_3$ via $Q_7$.

Thus, the circuit according to the present invention can efficiently prevent any malfunction due to external noise or the like, without requiring any complicated construction.

Figure 6:
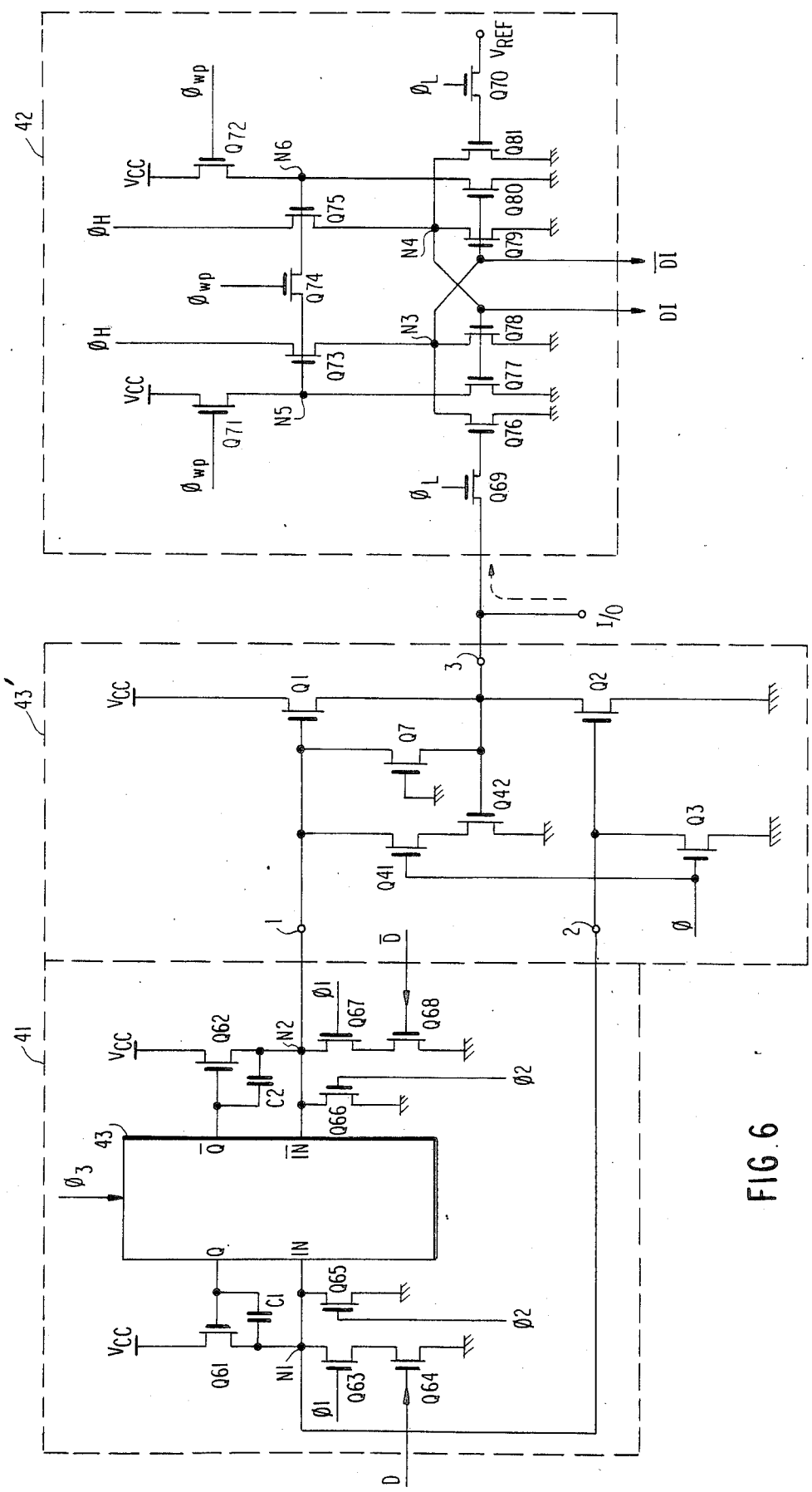
FIG. 6 is a schematic diagram showing the output circuit of the present invention in conjunction with other circuitry to provide an example of how the output circuit may be used in practice.

Referring to FIGS. 6 and 7, a detailed example of a data processing system employing the output circuit according to the present invention will be explained. The output circuit, identical to that of FIG. 3 is shown at 43' and is connected to a data amplifying circuit 41, which supplies the input signals to termnals 1 and 2 of output circuit 43'. The output circuit has its output terminal 3 connected to an input/output terminal I/O. In the example shown, it is assumed that the output circuit applies an output voltage to terminal I/O when the output circuit is in normal operation, and that the output circuit is placed in its high impedance state when an input voltage, from a circuit not shown, is applied to the I/O terminal. A data input circuit 42 is connected to the I/O terminal and is adapted to receive as its input, signals applied as inputs to the I/O terminal.

A data amplifying circuit 41 provides complementary data signals to the pair of input terminals 1 and 2 of the tri-state output circuit composed of the IGFET's $Q_1$, $Q_2$, $Q_3$, $Q_{41}$, $Q_{42}$ and $Q_7$. The amplifying circuit 41 includes a differential amplifier 43 having a pair of input terminals IN and $\overline{IN}$ and a pair of output terminals Q and $\overline{Q}$. An IGFET $Q_{63}$ receiving a first timing signal $\phi 1$ at its gate and an IGFET $Q_{64}$ receiving a time data signal D at its gate are connected in series between the input terminal IN and the ground potential. Similarly, an IGFET $Q_{67}$ receiving the first timing signal $\phi 1$ and an IGFET $Q_{68}$ receiving a complementary data signal $\overline{D}$ at its gate are connected in series between the input terminal $\overline{IN}$ and the ground potential. These four IGFET's $Q_{63}$, $Q_{64}$, $Q_{67}$ and $Q_{68}$ cooperate to write the true and complementary data signals D and $\overline{D}$ to the input terminals IN and $\overline{IN}$, respectively, in response to activation of the first timing signal $\phi 1$. It will be noted that IN and $\overline{IN}$ are connected to terminals 1 and 2 of the output circuit. However, the difference between the voltage levels at IN and $\overline{IN}$ is not sufficient to affect operation of the output circuit.

IGFET's $Q_{65}$ and $Q_{66}$ are connected between the input terminals IN and $\phi IN$ and the ground potential, respectively, and controlled by a second timing signal $\phi 2$. The IGFET's $Q_{65}$ and $Q_{66}$ enhance the operation speed of the circuit 41. IGFET's $Q_{61}$ and $Q_{62}$ operate as source follower transistors for transmitting the output signals at the terminals Q and $\overline{Q}$ to nodes $N_1$ and $N_2$, respectively.

The data input circuit 42 includes transfer IGFET's $Q_{69}$ and $Q_{70}$ for operatively inputting to a flip-flop circuit composed of IGFET's $Q_{71}$ to $Q_{81}$ write data from input/output terminal I/O and a reference voltage $V_{REF}$, respectively, in response to a sampling signal $\phi L$. The flip-flop circuit operatively generates true and complementary input signals DI and $\overline{DI}$ from nodes $N_3$ and N4, respectively, under control of signals φwp and φH.

Figure 7A:
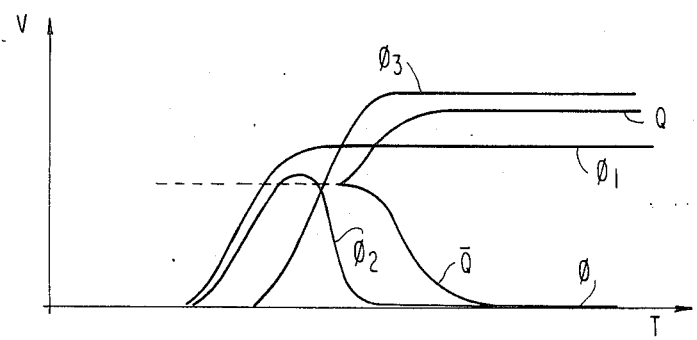
FIGS. 7A and 7B are waveform diagrams helpful in explaining the operation of parts of the circuitry of FIG. 6.

Operation with respect to the amplifying circuit 41 will be briefly explained with reference to FIG. 7A.

The timing signal φ1 is first activated so that the data signals D and $\overline{D}$ are written to the nodes $N_1$ and $N_2$ via the IGFET's $Q_{64}$ and $Q_{68}$, respectively. Then, the timing signal φ2 is activated for a short period to decrease the potentials at the nodes $N_1$ and $N_2$ to some extent. Next, the timing signal φ3 is activated to enable the circuit 43 so that true and complementary output signals Q and $\overline{Q}$ are developed. Throughout the above operation, the signal φ is held at the inactive low level.

Figure 7B:
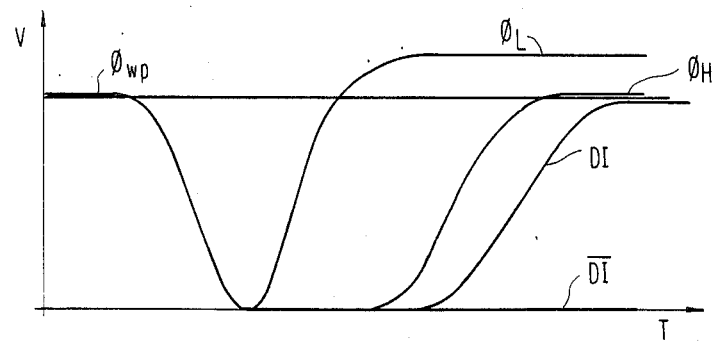

Referring to FIG. 7B, operation of the data input circuit 42 will be briefly explained. During a reset period, a control signal φwp is made active so that nodes $N_5$ and $N_6$ are charged by the power voltage Vcc. After the signal φwp is set inactive, the signal φL is activated so that an input signal at the input/output terminal I/O is input to the flip-flop circuit and compared with the reference potential $V_{REF}$. Thereafter, the signal φH is activated to amplify the potential difference between the nodes $N_3$ and $N_4$ so that the signals DI and $\overline{DI}$ are developed. Throughout the operation of the data input circuit 42, the signal φ to the output circuit is held high to make the output of the tri-state output circuit at a high impedance state.

Though the present invention has been explained in connection with a preferred embodiment, it should be apparent that the present invention is not limited to the embodiment described.

I claim:

1. In an output circuit having a first switching transistor coupled between a first voltage terminal and an output terminal, a second switching transistor coupled between said output terminal and a second voltage terminal, first means for supplying a gate of said first transistor with a first data signal, second means for supplying a gate of said second transistor with a second data signal having an opposite phase to said first data signal, and control means responsive to a control signal for clamping the gates of said first and second transistors at a potential that makes said first and second transistors non-conducting, the improvement comprising:

protection means coupled between said gate of said first transistor and said output terminal, said protection means providing a current path between said gate of said first transistor and said output terminal when an abnormal voltage is applied to said output terminal, said protection means comprising a third transistor having a source-drain current path coupled between said gate of said first transistor and said output terminal and having a gate connected to a reference voltage, and wherein said control means comprises a fourth transistor coupled between the gate of said second transistor and said second voltage terminal and having a gate receiving said control signal, and a series circuit of fifth and sixth transistors coupled between said gate of said first transistor and said second voltage terminal, a gate of said fifth transistor receiving said control signal, a gate of said sixth transistor being coupled to said output terminal.

2. An output circuit responsive to a control signal comprising, a first field effect transistor coupled between a first voltage terminal and an output terminal;

a second field effect transistor coupled between said output terminal and a second voltage terminal;
first means for applying a first signal to a gate of said first transistor;
second means for applying to a gate of said second transistor, a second signal of opposite phase to that of said first signal;
a third field effect transistor coupled between said gate of said first transistor and said output terminal and having a gate coupled to said second voltage terminal; and
control means responsive to a control signal for making said first and second transistors non-conducting, said control means comprising a fourth field effect transistor having a gate receiving said control signal coupled between the gate of said second transistor and said second voltage terminal, and a series circuit of fifth and sixth field effect transistors coupled between said gate of said first transistor and said second voltage terminal, a gate of said fifth transistor receiving said control signal, a gate of said sixth transistor being connected to said output terminal.

3. A output circuit according to claim 2, further comprising a flip-flop circuit, a transfer gate field effect transistor coupled between said output terminal and an input terminal of said flip-flop circuit, and means for controlling said transfer gate transistor.

4. An output circuit comprising a first switching field effect transistor coupled between a first voltage terminal and an output terminal, a second switching field effect transistor coupled between said output terminal and a second voltage terminal, said second voltage terminal receiving a reference voltage, said first voltage terminal receiving a first voltage of a first polarity, first means for supplying a gate of said first transistor with a first data signal, second means for supplying a gate of said second transistor with a second data signal having an opposite phase to said first data signal, and control means responsive to a control signal for clamping the gates of said first and second transistors at a potential that makes said first and second transistors non-conducting, said control means including a fourth transistor coupled between the gate of said second transistor and said second voltage terminal and having a gate receiving said control signal, and a series circuit of fifth and sixth transistor coupled between said gate of said first transistor and said second voltage terminal, a gate of said fifth transistor receiving said control signal, a gate of said sixth transistor being coupled to said output terminal, and;

protection means coupled between said gate of said first transistor and said output terminal, said protection means providing a current path between said gate of said first transistor and said output terminal when an abnormal voltage of a second polarity opposite to said first polarity with respect to said reference voltage is applied to said output terminal under the state that said control means clamps the gates of said first and second transistors.

5. The output circuit according to claim 4, wherein said protection means comprises a third transistor having a source-drain current path coupled between said gate of said first transistor and said output terminal and having a gate connected to said reference voltage.

6. The output circuit according to claim 4, further comprising an amplifier circuit for generating said first and second data signals.

7. An output circuit comprising,
a first field effect transistor coupled between a first voltage terminal and an output terminal;
a second field effect transistor coupled between said output terminal and a second voltage terminal, said second voltage terminal receiving a reference voltage, said first voltage terminal receiving a first voltage;
first means for applying a first signal to a gate of said first transistor;
second means for supplying to a gate of said second transistor, a second signal of opposite phase to that of said first signal;
control means responsive to a control signal for making said first and second transistors non-conducting; and
a third field effect transistor coupled between said gate of said first transistor and said output terminal and having a gate coupled to said second voltage terminal,
said third transistor assuming a conducting state when an abnormal voltage of a second polarity opposite to said first polarity is applied to said output terminal during the non-conducting state of both of said first and second transistors, said control means comprising a fourth field effect transistor having a gate receiving said control signal coupled between the gate of said second transistor and said second voltage terminal, and a series circuit of fifth and sixth field effect transistors coupled between said gate of said first transistor and said second voltage terminal, a gate of said fifth transistor receiving said control signal, a gate of said sixth transistor being connected to said output terminal.

8. The output circuit according to claim 7, further comprising a flip-flop circuit providing true and complement outputs, a transfer gate field effect transistor coupled between said output terminal and an input terminal of said flip-flop circuit, and means for controlling said transfer gate transistor.

9. An output circuit comprising a first switching transistor coupled between a first voltage terminal and an output terminal, a second switching transistor coupled between said output terminal and a second voltage terminal, said second voltage terminal receiving a reference voltage, said first voltage terminal receiving a first voltage of a first polarity,
first means for supplying a control electrode of said first transistor with a first data signal, second means for supplying a control electrode of said second transistor with a second data signal having an opposite phase to said first data signal, and control means responsive to a control signal for clamping the control electrodes of said first and second transistors at a potential that makes said first and second transistors non-conducting, and
protection means coupled between said control electrode of said first transistor and said output terminal, said protection means providing a current path between said control electrode of said first transistor and said output terminal when both an abnormal voltage of a second polarity opposite to said first polarity is applied to said output terminal and when said control means clamps the control electrodes of said first and second transistors, said cntrol means including a fourth transistor coupled between the control electrode of said second transistor and said second voltage terminal and having a control electrode receiving said control signal, and a series circuit of fifth and sixth transistors coupled between said control electrode of said first transistor and said second voltage terminal, a control electrode of said fifth transistor receiving said control signal, a control electrode of said sixth transistor being coupled to said output terminal.

10. The output circuit according to claim 9, wherein said protection means comprises a third transistor having a output current path coupled between said control electrode of said first transistor and said output terminal and having a control electrode connected to said reference voltage.

11. The output circuit according to claim 9, further comprising an amplifier circuit for generating said first and second data signals.

* * * * *